(12) United States Patent
Levinson et al.

(10) Patent No.: US 6,623,893 B1
(45) Date of Patent: *Sep. 23, 2003

(54) PELLICLE FOR USE IN EUV LITHOGRAPHY AND A METHOD OF MAKING SUCH A PELLICLE

(75) Inventors: Harry J. Levinson, Saratoga, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 09/770,730

(22) Filed: Jan. 26, 2001

(51) Int. Cl.⁷ .................................. G03F 9/00
(52) U.S. Cl. ........................... 430/5; 428/14
(58) Field of Search .................. 428/14, 99; 430/5

(56) References Cited

U.S. PATENT DOCUMENTS

| | | | |
|---|---|---|---|
| 4,608,326 A | * | 8/1986 | Neukermans et al. .......... 430/5 |
| 5,729,325 A | | 3/1998 | Kashida |
| 5,989,754 A | | 11/1999 | Chen et al. |
| 6,063,208 A | | 5/2000 | Williams |
| 6,280,886 B1 | * | 8/2001 | Yan .............................. 428/14 |

OTHER PUBLICATIONS

"Optical Microlithography III: Technology for the Next Decade", Harry L. Stover, Mar. 14–15, 1984, The International Society for Optical Engineering, pp 138–146.

* cited by examiner

*Primary Examiner*—Alexander S. Thomas
(74) *Attorney, Agent, or Firm*—Foley & Lardner

(57) ABSTRACT

A pellicle utilizes a film attached to a barrier layer above a substrate. The film is relatively transparent to radiation in the EUV range. The substrate and barrier layer are coupled to a periphery of the film and is exclusive of the center portion of the film. The pellicle can be manufactured by growing a relatively transparent film on a barrier layer that is grown on a substrate. The substrate and barrier layer are etched to expose a portion of the relatively transparent film.

20 Claims, 2 Drawing Sheets

PELLICLE FOR USE IN EUV LITHOGRAPHY AND A METHOD OF MAKING SUCH A PELLICLE

CROSS REFERENCE TO RELATED APPLICATIONS

The present invention s related to application Ser. No. 09/770,733, U.S. Pat. No. 6,544,693 filed on an even date herewith, by Levinson et al., entitled "A Pellicle For Use In Small Wavelength Lithography And A Method of Making Such A Pellicle," and U.S. patent application Ser. No. 09/771,236, filed on an even date herewith, by Levinson et al., entitled "A Pellicle for Use in Small Wavelength Lithography and a Method of Making Such a Pellicle Using A Silicon Layer".

FIELD OF THE INVENTION

The present invention relates generally to integrated circuit (IC) fabrication equipment. More particularly, the present invention relates to a pellicle and a method of manufacturing a pellicle.

BACKGROUND OF THE INVENTION

Semiconductor fabrication techniques often utilize a mask or reticle. Radiation is provided through or reflected off the mask or reticle to form an image on a semiconductor wafer. The wafer is positioned to receive the radiation transmitted through or reflected off the mask or reticle. The image on the wafer corresponds to the pattern on the mask or reticle. The radiation can be light, such as ultraviolet light, vacuum ultraviolet (VUV) light, extreme ultraviolet light (EUV) and deep ultraviolet light. The radiation can also be x-ray radiation, e-beam radiation, etc.

Generally, the image is utilized on the wafer to pattern a layer of material, such as, photoresist material. The photoresist material can be utilized to define doping regions, deposition regions, etching regions, or other structures associated with an integrated circuit (IC). A conventional lithographic system is generally utilized to project the image to the wafer. For example, conventional lithographic system includes a source of radiation, an optical system, and the reticle or photomask. The source of radiation provides radiation through the optical system and through or off of the mask or reticle. A pellicle can be employed between the light source and the wafer (i.e., between the mask and the wafer).

Generally, conventional fabrication systems which utilize wavelengths of 193 nm or more include the pellicle to seal off the mask or reticle to protect it from airborne particles and other forms of contamination. Contamination on the surface of the reticle or mask can cause manufacturing defects on the wafer. For example, pellicles are typically used to reduce the likelihood that particles might migrate into a stepping field of a reticle in a stepping lithographic system. If the reticle or mask is left unprotected, the contamination can require the mask or reticle to be cleaned or discarded. Cleaning the reticle or mask interrupts valuable manufacturing time and discarding the reticle or mask is costly. Replacing the reticle or mask also interrupts valuable manufacturing time.

The pellicle is generally comprised of a pellicle frame and a membrane. The pellicle frame may be comprised of one or more walls which is securely attached to a chrome side of the mask or reticle. Pellicles have also been employed with antireflective coatings on the membrane material.

The membrane is stretched across the metal frame and prevents the contaminates from reaching the mask or reticle. The membrane is preferably thin enough to avoid the introduction of aberrations and to be optically transparent and yet strong enough to be stretched across the frame. The optical transmission losses associated with the membrane of the pellicle can affect the exposure time and throughput of the lithographic system. The optical transmission losses are due to reflection, absorption and scattering. Stretching the membrane ensures that it is flat and does not adversely affect the image projected onto the wafer.

The membrane of the pellicle generally covers the entire printable area of a mask or reticle and is sufficiently durable to withstand mild cleaning and handling. Conventional membrane materials are preferably configured to be stable enough to retain their shape over long periods of time and many exposures to flashes of radiation. Membrane materials are typically thin polymer films that do not appreciably change the optical projection of the lithographic system and that do not contribute to pattern misplacement and other imaging aberrations. The membrane materials should also be inexpensive enough to be cost effective. The membrane can be manufactured from nitrocellulose and have a thickness of 1 to 15 micrometers (typically approximately 2.9 micrometers).

Other pellicle membrane materials include polymers, such as, fluoropolymers or cellulose acetate which can be coated with one or more layers of fluoropolymers (anti-reflective coatings (ARC)). The average transmissions of a pellicle with a 2.9 micrometer thick nitrocellulose membrane and an anti-reflective coating can be approximately 99 percent at wavelengths of 350–450 nm. Another conventional pellicle material includes Mylar® polymer material.

Small particles that adhere to the pellicle surface (the membrane) generally do not significantly obstruct light directed to the surface of the wafer. The metal frame ensures that a minimum stand-off distance from the mask is provided to ensure that no more than a 10% reduction in light intensity on the wafer surface is achieved for a particle of a particular size. The pellicle also keeps particles out of the depth of field of the lens. Thus, the stand-off distance prevents contaminates from being effectively imaged onto the wafer.

Adhesive materials can be utilized to attach the pellicle membrane to the frame and the frame to the reticle or mask. Compressive material such as silicone or other natural and synthetic rubbers can be utilized as adhesives.

Membranes made of nitrocellulose and Mylar® have limited usefulness in deep UV applications because both exhibit strong absorption near 300 nanometers. In addition, these materials can change color when exposed to deep UV light. Conventional membrane materials, such as, thin polymer films, are not transparent after repeated use at vacuum ultraviolet (VUV) (100–180 nm) frequencies. For example, the radiation provided through the pellicle can discolor and degrade the membrane.

Further, conventional membranes are not suitably transparent for EUV lithographic applications (e.g., wavelengths less than 14 nm). The membrane materials tend to absorb substantially all of the light in the EUV range.

Thus, there is a need for a pellicle which does not utilize conventional materials. Further still, there is a need for a pellicle which is more durable or stable than conventional materials. Further still, there is a need for a pellicle optimized for use in EUV applications or advanced lithography. Even further still, there is a need for a method of manufacturing a pellicle which does not include a conventional membrane and does include a membrane suitable for EUV applications.

SUMMARY OF THE INVENTION

An embodiment relates to a pellicle for integrated circuit fabrication equipment. The pellicle includes a film relatively transparent to radiation having a wavelength of less than 14 nanometers and a substrate. The film has a periphery and a center portion. The substrate is coupled to the periphery of the film and is exclusive of the center portion. Radiation can be transmitted through the center portion.

Another embodiment relates to a pellicle for fabrication equipment. The pellicle includes a means for allowing radiation to pass and a means for supporting at a periphery the means for allowing the radiation to pass. The pellicle also includes a barrier means between the means for supporting to a reticle or a photomask and the mask for allowing.

Yet another embodiment relates to a method of manufacturing a pellicle. The method includes forming a film on a substrate and removing a portion of the substrate. The film has a first side adjacent to a second side of the substrate. The portion of the substrate is removed to expose a portion of the side of the film.

Still another embodiment relates to a method of forming a pellicle relatively transparent to EUV radiation. The method includes growing a relatively transparent film on a substrate and etching the substrate to expose a portion of the relatively transparent film.

BRIEF DESCRIPTION OF THE DRAWINGS

Exemplary embodiment will hereafter be described with reference to the accompanying drawings, wherein like numerals denote like elements, and.

DETAILED DESCRIPTION OF PREFERRED EXEMPLARY EMBODIMENTS

Figure 1:
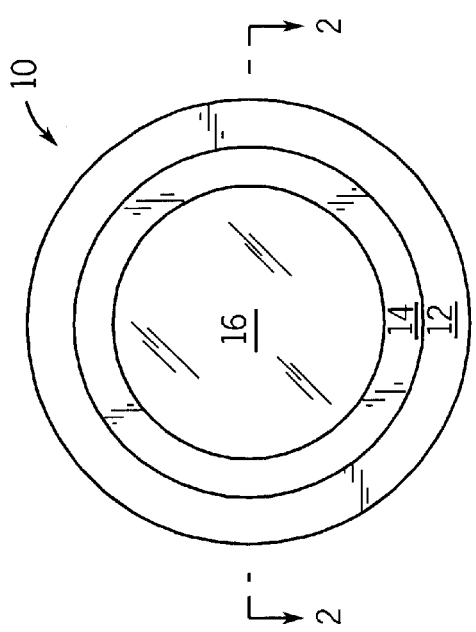
FIG. 1 is a bottom view of a pellicle in accordance with an exemplary embodiment.

With reference to FIG. 1, a pellicle 10 is provided for use with semiconductor fabrication equipment. Preferably, pellicle 10 can be utilized in extreme ultraviolet (EUV) lithography wherein radiation having a wavelength of less than 14 nm is utilized (preferably between 11 and 14 nm). For example, radiation or ultraviolet light at a wavelength of 11 nm can be provided through pellicle 10.

Pellicle 10 can be utilized in various types of lithographic systems and equipment. For example, pellicle 10 can be employed at other locations with respect to the EUV lithographic system.

Figure 2:
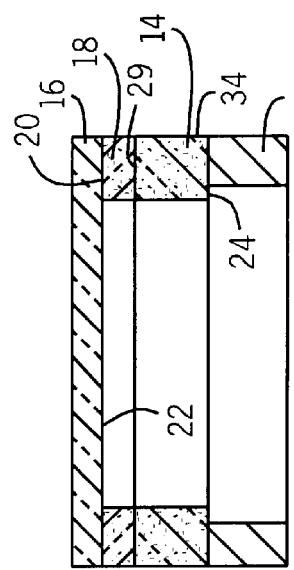
FIG. 2 is a cross-sectional view of the pellicle illustrated in FIG. 1 about line 2—2.

With reference to FIGS. 1 and 2, pellicle 10 includes a frame 12, a substrate 14, a barrier layer 18 and a film 16. Pellicle 10 is shown as a circularly-shaped pellicle, although any shape appropriate for semiconductor or integrated circuit (IC) fabrication equipment is possible.

Film 16 is preferably a thin film or layer which is relatively transparent to radiation, such as, EUV radiation. The term "relatively transparent" in this application refers to sufficient transmission of light for appropriate functioning of lithographic processes (e.g., sufficiently transparent for EUV applications). For example, film 16 must allow sufficient light so that photoresist material can be patterned on a semiconductor wafer in accordance with a reticle or mask. Film 16 is also preferably a material that is relatively robust or stable at EUV wavelengths and relatively flat and smooth so that significant optical distortion is not caused by film 16.

Film 16 is preferably a 0.1–2.0 micron thick silicon or other suitable material. The thickness of film 16 is preferably chosen for transparency at the particular EUV wavelength. For example, film 16 can be 0.5 microns thick. The thickness is chosen to maximize transmission. Silicon is relatively transparent at EUV wavelengths and is robust and stable enough to withstand multiple exposures to such radiation. Alternatively, other thicknesses of film 16 are possible.

Film 16 is preferably thin enough to allow sufficient amount of light transmission and yet thick enough to have sufficient stability. Film 16 is preferably manufactured from a material which shows stability over a large number of exposures to radiation, unlike conventional pellicle membranes.

Film 16 is preferably under tensile stress. By providing tensile stress to film 16, adverse effects associated with gravity are reduced. For example, gravity can cause film 16 to bend, thereby adversely effecting the image associated with the reticle or photomask. The tensile stress is provided in a radial direction (laterally). Tensile stress refers to a lateral force or tension less than the maximum film 16 can withstand without breaking. Film 16 can also include fluorine for optical stability.

Film 16 is disposed on top of barrier layer 18. Barrier layer 18 is preferably a ring-shaped layer attached to a periphery 20 of film 16. Barrier layer 18 is attached to substrate 14. Substrate 14 is preferably a ring-shaped layer attached to a surface 29 of layer 18. A center portion 22 of film 16 is exclusive of substrate 14 and layer 18. Layer 18 is preferably positioned between film 16 and substrate 14 such that opposite surface of layer 18 are in contact with film 16 and substrate 14. A surface 24 of substrate 14 is connected to frame 12.

Similar to substrate 14 and barrier layer 18, frame 12 is a ring-like structure. Frame 12 can be a plastic material, a glass material, a ceramic material or a metal material, Preferably, frame 12 can be an anodized aluminum structure. Frame 12 can be a glass material that contains appreciable oxide of boron and is resistant to heat, chemicals and electricity. The glass material facilitates bonding to substrate 14. Frame 12 provides structural support for pellicle 10 and provides a structure for attaching pellicle 10 to the mask or reticle.

The outer diameter of film 16, substrate 14, layer 18 and frame 12 can be equal. An inner diameter of frame 12 is preferably greater than an inner diameter of substrate 14.

The inner diameter of substrate 14 and layer 18 can be equal. Alternatively, the inner diameter of barrier layer 18 can be greater than the inner diameter of substrate 14. Alternatively, the inner diameter of substrate 14 and frame 12 can be equal.

Pellicle 10 can be a variety of sizes depending upon application parameters. For example, pellicle 10 may have a diameter of 120 mm, 150 mm, or even 300 mm or more. Application parameters and semiconductor tool requirements can effect the required dimensions for pellicle 10. Pellicle 10 can also be a variety of shapes. One preferred shape for pellicle 10 is a square or rectangle. The area of pellicle 10 (27×22×25) is typically 25 times larger than the wafer filed size which can be 22 mm×27 mm.

The thicknesses of frame 12, layer 18, substrate 14 and film 16 are designed in accordance with the optical system associated with the lithographic tools. The thicknesses of film 16, layer 18, substrate 14 and frame 12 are designed to provide the proper standoff distance. With typical depths-of-focus less than 1 mm, millimeter stand-offs are expected to blur the image of the particles significantly. The requirements of pellicles go beyond bluring the images of particulate defects. Pellicle stand-offs must be large enough to prevent defects from reducing the light intensity of the desired mask patterns significantly. Theoretical studies have shown that image intensities are not affected by amounts greater than 10% as long as the pellicle stand-off is at least as large as $$T_0 = \frac{M}{2NA\varepsilon_0}d$$

Where M is the lens reduction, NA is the numerical aperture of the lens, $\varepsilon_0$ is a function of the normalized defect (e.g., $\varepsilon_0=\frac{1}{8}$) and d is the diameter of the particle on profile. Stand-off distance is discussed in A. Flamholz, "An Analysis of Pellicle Parameters for Step-and-Repeat Projection," SPIE Vol. 470, pp. 138–146, 1984.

The thickness of layer 18 is 0.1 to 2.0 micrometers. Layer 18 is preferably silicon dioxide ($SiO_2$), silicon nitride ($Si_2N_4$) or other material having etch characteristics different than substrate 14 and film 16.

The thickness of substrate 14 can be any conventional standard thickness for substrates, such as, a SEMI standard semiconductor substrates (such as, 200 millimeters (mm) thick silicon substrate). Substrate 14 can be the same material as film 16. In one embodiment, substrate 14 is silicon. Preferably, the thickness of film 16 is chosen to maximize light transmission and uniformity. Film 16 can be coupled with an antireflective coating (ARC) as discussed below with reference to FIG. 9.

With reference to FIGS. 1–5, an exemplary method for fabricating pellicle 10 is described below as follows. As discussed above, pellicle 10 is manufactured without using conventional membrane materials which can be subject to discoloration over multiple use in the EUV frequency range.

Figure 3:
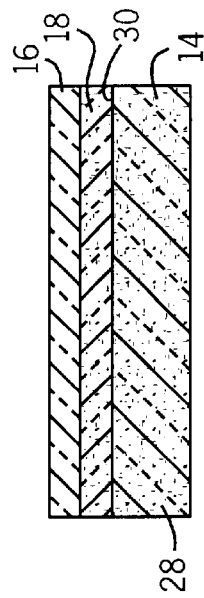
FIG. 3 is a cross-sectional view of the pellicle illustrated in FIG. 2, showing a film formation step.

In FIG. 3, a substrate material 28, such as, a silicon wafer, is provided as substrate 14. Material 28 can be a variety of shapes, thicknesses and sizes. Material 28 can be cut to particular sizes and shapes. Preferably, material 28 is 200 mm thick. A top surface 30 of substrate 14 is preferably relatively flat and smooth. Surface 30 can be subject to a polishing process. Material 28 can also be any relatively smooth and flat material upon which barrier layer 18 can be grown or deposited.

Barrier layer 18 can be grown or deposited as silicon dioxide or silicon nitride on substrate 14. According to one embodiment, layer 18 can be silicon dioxide formed by thermal oxidation. Substrate 14 is exposed to an oxidizing atmosphere ($O_2$, $H_2O$) at elevated temperatures. Alternatively, plasma anodization and wet anodization can be utilized for layer 18 on substrate 14. According to another embodiment, layer 18 is a layer of silicon nitride formed by a high temperature (950–1200° C.) nitridation of substrate 14 (silicon) in an ammonia environment or ammonia plasma. During growth or deposition, fluorine can be utilized to increase the stability of layer 18. Layer 18 can be subject to a polishing process. As discussed below, layer 18 should have different etching properties than film 16 and substrate 14 so that it can be selectively etched.

Film 16 can be grown or deposited on barrier layer 18 by semiconductor fabrication techniques, such as, chemical vapor deposition (CVD) low temperature (LT) growth techniques, etc. Film 16 comprised of, such as, silicon material, can be deposited or grown.

Figure 4:
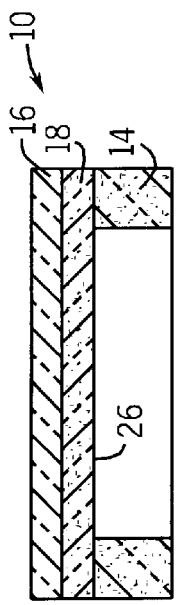
FIG. 4 is a cross-sectional view of the pellicle illustrated in FIG. 3, showing a substrate removal step.

With reference to FIG. 4, after film 16 is provided on layer 18, material 28 is etched to form substrate 14. Preferably, the etching of material 28 exposes center portion 26 of layer 18. A variety of removal processes can be utilized. Preferably, a wet etch selective to material 28 (e.g., silicon) is utilized. For example, a potassium hydroxide (KOH) etch can be utilized. Alternative etching chemistries, such as, nitric acid, hydroflouric acid, and mixtures thereof can be utilized. Further, dry etching, mechanical and other removal processes can be utilized to expose center portion 26.

A lithographic process can be utilized to define portion 26. Preferably, portion 26 is large enough so that substrate 14 does not interfere with light provided through pellicle 10. The lithographic processes do not require significant resolution as long as center portion 26 covers the entire focus area of the lithographic equipment.

Figure 5:
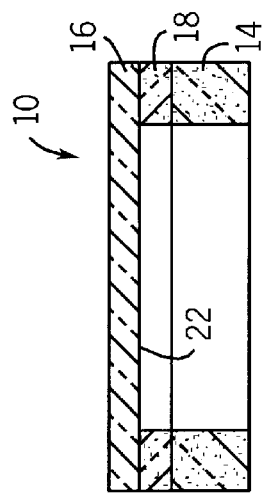
FIG. 5 is a cross-sectional view of the pellicle illustrated in FIG. 4, showing a barrier layer removal step.

With reference to FIG. 5, after center portion 26 is exposed, barrier layer 18 is etched to expose center portion 22 of film 16. A variety of removal processes can be utilized. Preferably, a phosphoric acid etch can be utilized if layer 18 is silicon nitride and a nitrogen fluorine etch can be utilized if layer 18 is silicon dioxide. Alternative etching chemistries can also be utilized. Further, dry etching, mechanical and other removal processes can be utilized to expose center portion 22 of film 16.

A lithographic process can be utilized to define portion 22.

Radiation is provided through portion 22 during lithographic operations.

Preferably, portion 22 is large enough so that layer 18 does not interfere with light provided through pellicle 10. The lithographic processes do not require significant resolution as long as center portion 22 covers the entire focus area of the lithographic equipment.

With reference to FIGS. 1 and 2, after material 28 and layer 18 are etched, frame 12 is attached to substrate 14. Frame 12 can be attached by an adhesive, such as, silicone or bonded. Alternatively, mechanical systems can attach frame 12 to substrate 14. According to an alternative embodiment, frame 12 can be attached to a side 34 of substrate 14. Frame 12 provides structural stability for substrate 14 and film 16. According to another alternative, frame 12 can be attached to material 28 even before material 28 is etched, before layer 18 is etched and even before film 16 is provided.

Material 28 is preferably provided under tensile stress as film 16 is deposited or grown. Material 28 can be placed under tensile stress by choice of deposition conditions. In this way, material 28 causes film 16 to be under tensile stress (to be stretched out), thereby relieving some of the effects of gravity.

Figure 8:
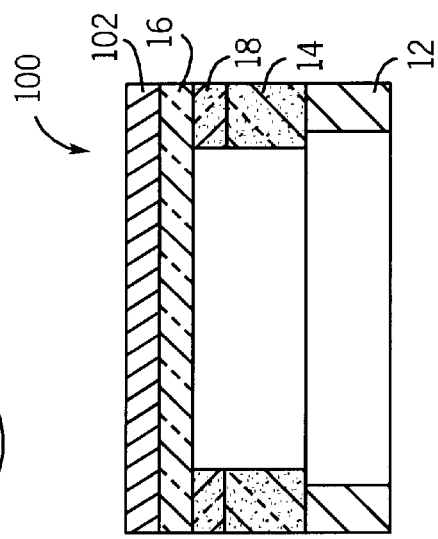
FIG. 8 is a bottom view of still another alternative exemplary embodiment of a pellicle similar to the pellicle illustrated in FIG. 1, the pellicle of the still another embodiment has an oval shape.
Figure 6:
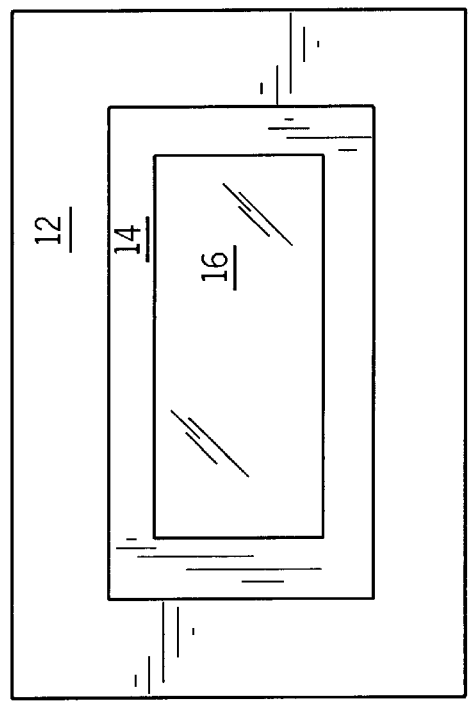
FIG. 6 is a bottom view of an alternative exemplary embodiment of a pellicle similar to the pellicle illustrated in FIG. 1, the pellicle of the alternative embodiment has a rectangular shape.
Figure 7:
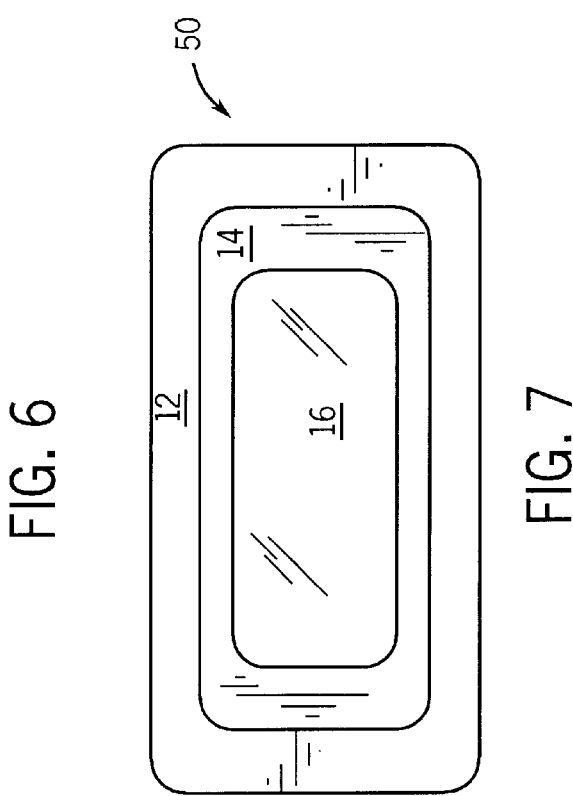
FIG. 7 is a bottom view of another alternative exemplary embodiment of a pellicle similar to the pellicle illustrated in FIG. 1, the pellicle of the another alternative embodiment has a rectangular shape with rounded corners.

With reference to FIG. 6, a rectangular-shaped pellicle 40, similar to pellicle 10 (FIG. 1) is shown. For example, pellicle 40 can have dimensions of approximately 120 millimeters by 150 millimeters. Pellicle 40 includes frame 12, substrate 14, barrier layer 18 and film 16. With reference to FIG. 7, a pellicle 50 is shown having a rectangular shape with rounded edges. Pellicle 50 is similar to pellicle 10 (FIG. 1) and includes frame 12, substrate 14, barrier layer 18 and film 16. With reference to FIG. 8, a pellicle 60 has an oval shape and is similar to pellicle 10 (FIG. 1). Pellicle 60 includes frame 12, substrate 14, barrier layer 18 and film 16. Pellicles 40, 50, and 60 are manufactured in accordance with the process described above with reference to FIGS. 1–5.

Figure 9:
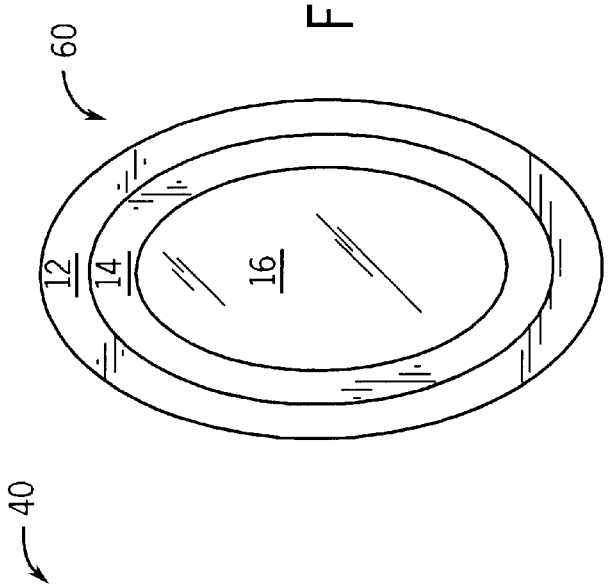
FIG. 9 is a bottom view of yet still another alternative exemplary embodiment of a pellicle similar to the pellicle described in FIG. 1, the pellicle includes an anti-reflective coating.

With reference to FIG. 9, a pellicle 100 is similar to pellicle 10 25 (FIG. 1). Pellicle 100 includes frame 12, substrate 14, barrier layer 18 and film 16. In addition, pellicle 100 includes an antireflective coating (ARC) 102 provided on film 16. Alternatively, antireflective coating 102 can be provided between film 16 and substrate 14. Coating 102 can be variety of materials including calcium fluoride ($CaF_2$).

Conventional thicknesses can be used for coating 102. Preferably, coating 102 has a thickness equal to an integer multiple of one fourth the wavelength of light utilized by the tool in which pellicle 100 is employed ($n*\lambda/4$, where n is an integer and $\lambda$ is the wavelength of light transmitted through pellicle 100). Pellicle 100 can employ more than one layer 102. An exemplary thickness for coating 102 is less than 1 micron for EUV applications.

Pellicle 100 is manufactured in accordance with the process described above with reference to FIGS. 1–5. Coating 102 is preferably provided before frame 12 is attached.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular films, barrier layers, and substrates are described, other materials can be utilized. Various changes may be made to the details disclosed without departing from the spirit of the invention which is defined by the following claims.

What is claimed is:

1. A pellicle for integrated circuit fabrication equipment, the pellicle comprising:
    a silicon film relatively transparent to radiation having a wavelength of less than 14 nanometers, the film having a periphery and a center portion, the silicon film being under tensile stress;
    an anti-reflective coating, the anti-reflective coating being disposed on the film; and
    a substrate coupled to the periphery of the film and exclusive of the center portion, whereby the radiation can be transmitted through the center portion.

2. The pellicle of claim 1, farther comprising a frame coupled to the substrate.

3. The pellicle of claim 2, wherein the frame is metal.

4. The pellicle of claim 2, wherein the frame is plastic.

5. The pellicle of claim 2, wherein the substrate includes a first surface coupled to the frame and a second surface opposite the first surface, the second surface being adhered to the film.

6. The pellicle of claim 2, wherein the substrate includes a first surface coupled to the frame and a second surface, the first surface being a non-parallel surface with respect to the second surface, the second surface being parallel with the film.

7. The pellicle of claim 1, further comprising:
    a barrier layer between the substrate and the film.

8. The pellicle of claim 7, where the barrier layer is silicon nitride.

9. The pellicle of claim 1, where the coating is calcium fluoride.

10. The pellicle of claim 1, wherein the substrate includes silicon.

11. The pellicle of claim 1, wherein the film is deposited under tensile stress.

12. A pellicle for fabrication equipment, the pellicle comprising:
    a means for allowing radiation to pass;
    a means for supporting the means for allowing the radiation to pass at a periphery of the means for allowing, the means for allowing being under tensile stress; and
    a barrier means between the means for allowing and the means for supporting, the means for allowing including a thin silicon film.

13. The pellicle of claim 12, wherein the means for allowing is silicon.

14. The pellicle of claim 12, wherein the barrier means includes silicon nitride.

15. The pellicle of claim 12, wherein means for supporting includes silicon.

16. The pellicle of claim 12, further comprising:
    a means for reducing reflections from the means for allowing radiation to pass.

17. The pellicle of claim 12, wherein the means for allowing is under tensile stress to reduce distortion due to gravity.

18. A pellicle comprising:
    a film on a substrate, wherein a first side of the film is adjacent a second side of the substrate, the film being a silicon fi under tensile stress; and
    an anti-reflective coating on the film.

19. The pellicle of claim 18, wherein the anti-reflective coating includes calcium flouride.

20. The pellicle of claim 18, wherein the film is provided above a silicon nitride layer.

* * * * *

UNITED STATES PATENT AND TRADEMARK OFFICE
CERTIFICATE OF CORRECTION

PATENT NO. : 6,623,893 B1
DATED : September 23, 2003
INVENTOR(S) : Harry J. Levinson and Christopher F. Lyons It is certified that error appears in the above-identified patent and that said Letters Patent is hereby corrected as shown below:

<u>Column 8,</u>
Line 1, replace the word "farther" with the word -- further --;
Line 40, insert the word -- the -- after the word "wherein";
Line 52, replace the word "fi" with the word -- film --.

Signed and Sealed this

Twenty-fifth Day of November, 2003

JAMES E. ROGAN
*Director of the United States Patent and Trademark Office*